(12) United States Patent
Araoka

(10) Patent No.: US 9,838,631 B2
(45) Date of Patent: Dec. 5, 2017

(54) SOLID STATE IMAGING DEVICE AND METHOD OF DRIVING SOLID STATE IMAGING DEVICE

(71) Applicant: CANON KABUSHIKI KAISHA, Tokyo (JP)

(72) Inventor: Yukio Araoka, Hiratsuka (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 20 days.

(21) Appl. No.: 14/556,476

(22) Filed: Dec. 1, 2014

(65) Prior Publication Data

US 2015/0189203 A1    Jul. 2, 2015

(30) Foreign Application Priority Data

Dec. 26, 2013  (JP) .................................. 2013-269556

(51) Int. Cl.
*H04N 5/378*    (2011.01)
*H03M 1/34*    (2006.01)

(52) U.S. Cl.
CPC .............. *H04N 5/378* (2013.01); *H03M 1/34* (2013.01)

(58) Field of Classification Search
CPC ........ H04N 5/378; H03M 1/123; H03M 1/34; H03M 1/345; H03M 1/36
USPC .................. 341/164, 165, 166, 169
See application file for complete search history.

(56) References Cited

U.S. PATENT DOCUMENTS

| 6,067,113 A * | 5/2000 | Hurwitz ............... H04N 5/3658 |
| | | 348/241 |
| 8,089,541 B2 | 1/2012 | Oike |
| 8,358,349 B2 | 1/2013 | Nishi |
| 8,704,898 B2 | 4/2014 | Nishi |
| 8,902,342 B2 | 12/2014 | Araoka et al. |
| 9,479,189 B2 | 10/2016 | Nishi |
| 2012/0138775 A1* | 6/2012 | Cheon .................... H04N 5/361 |
| | | 250/208.1 |
| 2012/0262614 A1* | 10/2012 | Deng .................. H03M 1/0641 |
| | | 348/302 |
| 2014/0375855 A1* | 12/2014 | Nishihara ......... H01L 27/14603 |
| | | 348/301 |
| 2014/0375859 A1 | 12/2014 | Ono et al. |
| 2015/0009371 A1 | 1/2015 | Araoka |

(Continued)

FOREIGN PATENT DOCUMENTS

| JP | 2006-352597 | 12/2006 |
| JP | 2008-098722 | 4/2008 |

OTHER PUBLICATIONS

Japanese Office Action dated Oct. 17, 2017 during prosecution of related Japanese application No. 2013-269556.

*Primary Examiner* — Daniel M Pasiewicz

(74) *Attorney, Agent, or Firm* — Fitzpatrick, Cella, Harper & Scinto

(57) ABSTRACT

A solid state imaging device includes a pixel circuit 102 configured to generate a pixel signal by photoelectric conversion, a reference signal generation circuit 115 configured to generate a reference signal which changes in level with time, and a plurality of comparators configured to, based on the reference signal generated by the reference signal generation circuit, compare a plurality of reference signals being given offset voltages differing from each other, with the pixel signal, or compare a plurality of pixel signals being given offset voltages differing from each other, with the reference signal.

12 Claims, 10 Drawing Sheets

(56) References Cited

U.S. PATENT DOCUMENTS

2015/0009385 A1 1/2015 Tsukida et al.
2015/0244959 A1 8/2015 Araoka

* cited by examiner

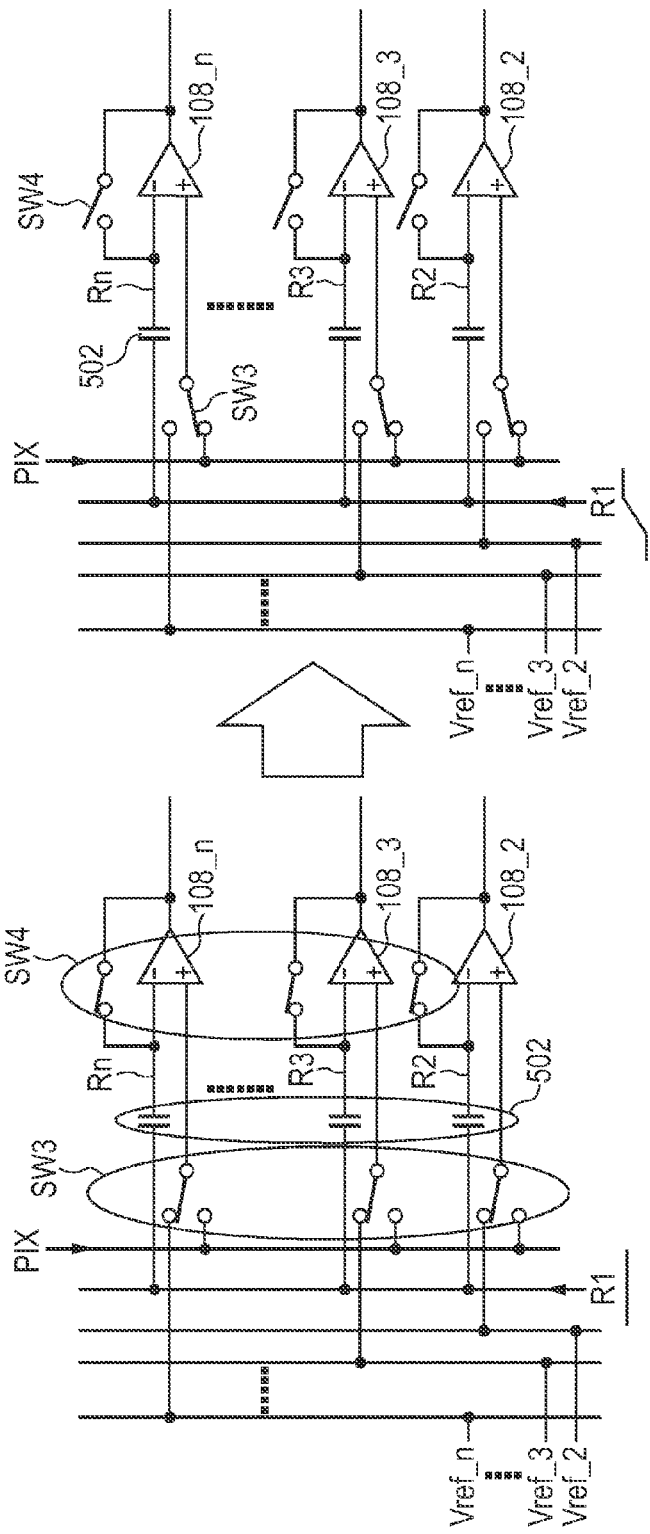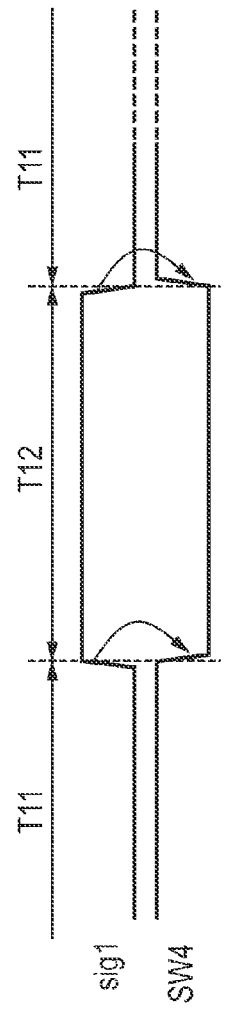
FIG. 6B
FIG. 6A
FIG. 6C

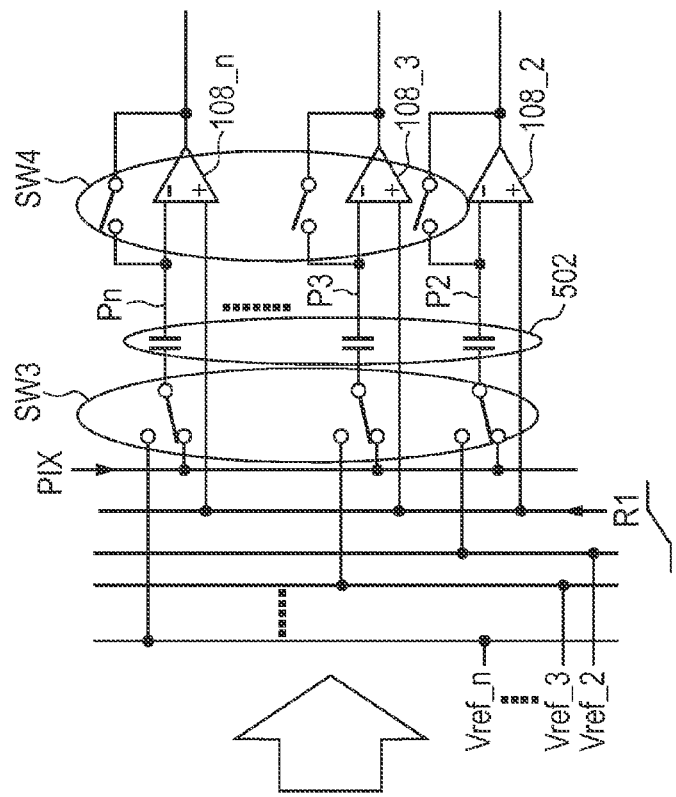
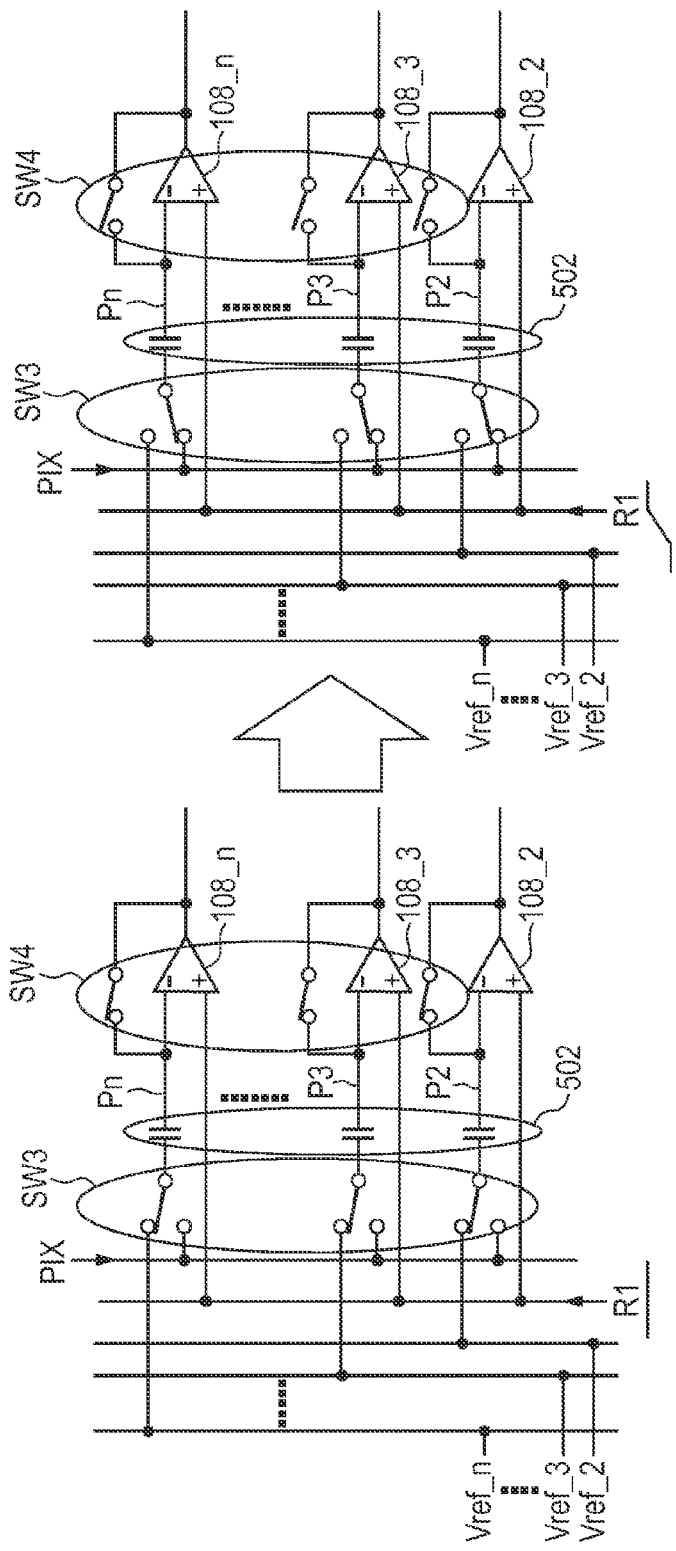
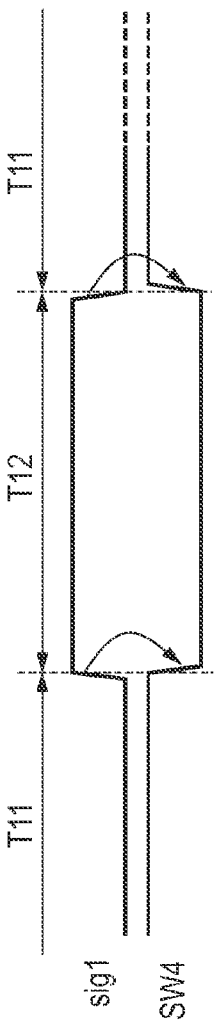
FIG. 11A
FIG. 11B
FIG. 11C

SOLID STATE IMAGING DEVICE AND METHOD OF DRIVING SOLID STATE IMAGING DEVICE

BACKGROUND OF THE INVENTION

Field of the Invention

The present invention relates to a solid state imaging device and a method of driving the solid state imaging device.

Description of the Related Art

A solid state imaging device including an analog-digital converter is known (refer to, for example, Japanese Laid-Open Patent Publication No. 2008-098722 (Patent Reference 1)). As for a pixel array unit, unit pixels each including a photoelectric conversion element are two-dimensionally arranged in a matrix form, and a column signal line is wired every column in the matrix arrangement of the unit pixels. A row scanning unit selects and controls respective unit pixels in the pixel array unit every row. The analog-digital converter converts an analog signal output from a unit pixel in the row selected and controlled by the row scanning unit via the column signal line to a digital signal. The analog-digital converter includes a first comparison unit, a second comparison unit, and a counting unit. The first comparison unit compares the analog signal with any one of a plurality of first reference voltages taking a slope shape and having inclinations which are identical with each other. The second comparison unit compares a second reference voltage which is different from the first reference voltage in slope inclination with any one of the plurality of the first reference voltages used in the first comparison unit. The counting unit conducts count operation with a count quantity depending upon comparison results in the first and second comparison units, and converts a count value to the digital signal.

SUMMARY OF THE INVENTION

A solid state imaging device includes a pixel circuit configured to generate a pixel signal by photoelectric conversion, a reference signal generation circuit configured to generate a reference signal which changes in level with time, and a plurality of comparators configured to, based on the reference signal generated by the reference signal generation circuit, compare a plurality of reference signals being given offset voltages differing from each other, with the pixel signal, or compare a plurality of pixel signals being given offset voltages differing from each other, with the reference signal.

Further features of the present invention will become apparent from the following description of exemplary embodiments with reference to the attached drawings.

BRIEF DESCRIPTION OF THE DRAWINGS

FIGS. 6A, 6B and 6C are diagrams illustrating a method of controlling switches.

FIGS. 11A, 11B and 11C are diagrams illustrating a method of controlling switches.

DESCRIPTION OF THE EMBODIMENTS

Preferred embodiments of the present invention will now be described in detail in accordance with the accompanying drawings.

In a solid state imaging device that converts an analog signal to a digital signal by comparing an analog signal with a reference voltage, it is difficult to reconcile a higher speed and a higher resolution of the conversion. In the solid state imaging device described in the Patent Reference 1, a higher resolution is attained, and consequently the speed is lowered.

A technique described hereafter relates to a solid state imaging device and a method of driving thereof capable of reconciling a higher speed and a higher resolution.

A First Embodiment

Figure 1:
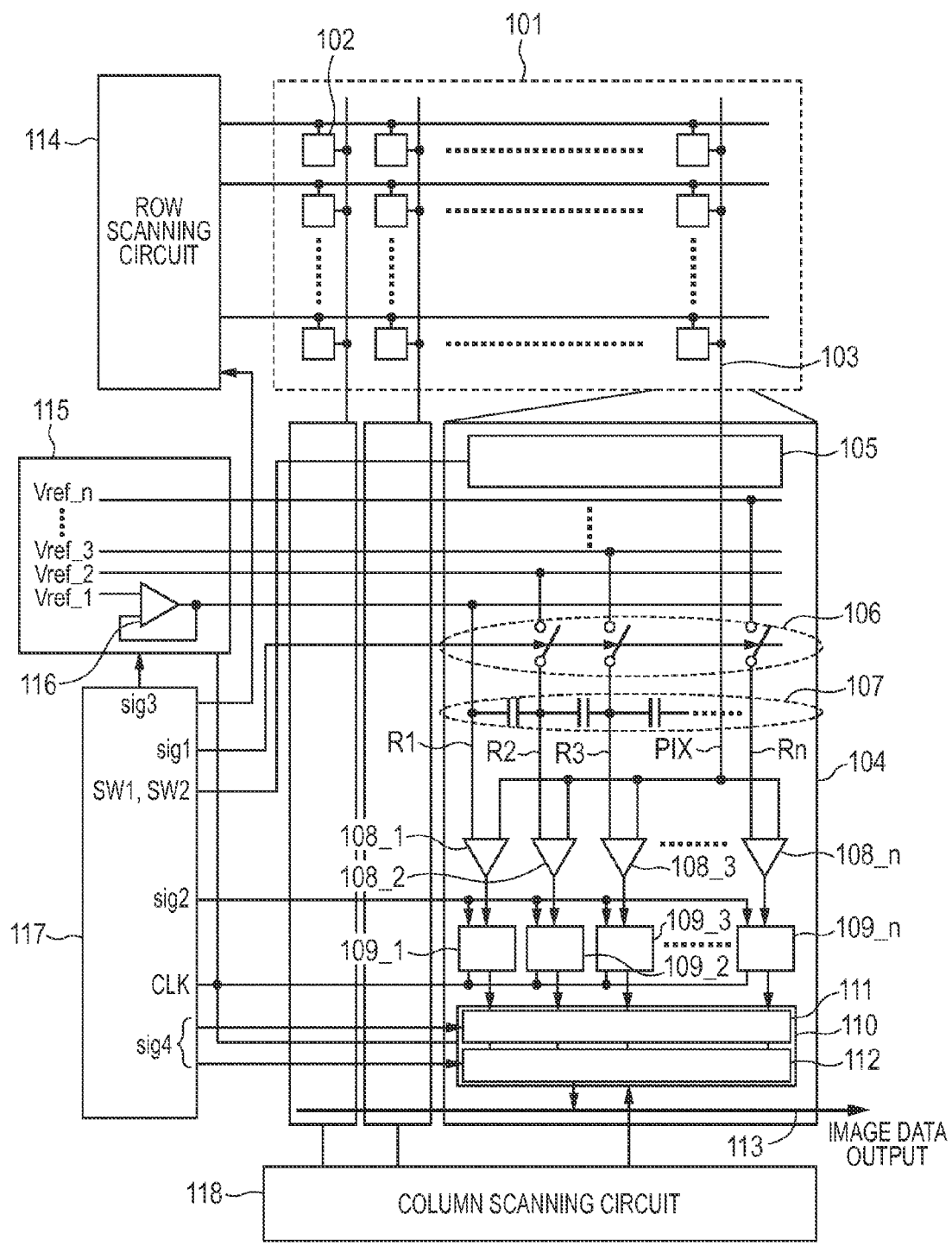
FIG. 1 is a diagram illustrating a configuration example of a solid state imaging device according to a first embodiment of the present invention.

FIG. 1 is a diagram illustrating a configuration example of a solid state imaging device according to a first embodiment of the present invention. A pixel array 101 includes a plurality of pixel circuits 102 arranged in a two-dimensional matrix form. Each of the plurality of pixel circuits 102 generates a pixel signal by photoelectric conversion.

Figure 2:
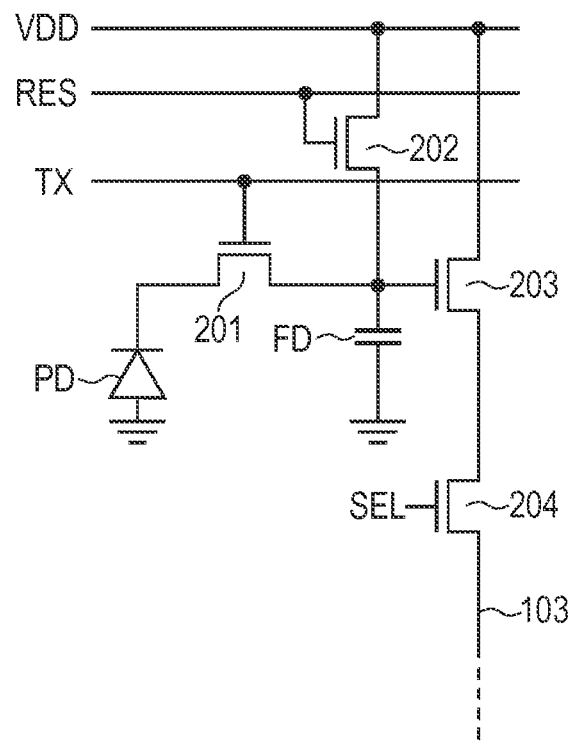
FIG. 2 is a circuit diagram illustrating a configuration example of a pixel circuit illustrated in FIG. 1.

FIG. 2 is a circuit diagram illustrating a configuration example of the pixel circuit 102 in FIG. 1. The pixel circuit 102 includes a photoelectric conversion unit PD, a floating diffusion region FD, a transfer transistor 201, a reset transistor 202, an amplifier transistor 203, and a select transistor 204. The pixel circuit 102 generates the pixel signal by photoelectric conversion. The photoelectric conversion unit PD is, for example, a photodiode, and converts light to charge (electrons) and stores the charge (electrons). When a signal TX becomes a high level, the transfer transistor 201 turns on and transfers the charge stored in the photoelectric conversion unit PD to the floating diffusion region FD. The floating diffusion region FD stores charge and converts the charge to a voltage. The amplifier transistor 203 is connected at a drain thereof to a node of a power supply voltage VDD. The amplifier transistor 203 amplifies the voltage of the floating diffusion region FD and outputs a resultant voltage from a source thereof. When a signal SEL becomes a high level, the select transistor 204 turns on and outputs the voltage which is output from the source of the amplifier transistor 203 to a vertical output line 103. When the signal RES becomes a high level, the reset transistor 202 turns on and resets the voltage of the floating diffusion region FD and/or the photoelectric conversion unit PD to the power supply voltage VDD. A row scanning circuit 114 in FIG. 1 outputs same signals TX, RES and SEL to the pixel circuits 102 on the same row under control of a timing generation circuit 117.

In FIG. 1, the vertical output lines 103 on respective columns are connected to the pixel circuits 102 in common on respective columns, respectively. Column processing circuits 104 on respective columns are connected to the vertical output lines 103 on respective columns, respectively. The column processing circuit 104 includes a column amplifier circuit 105, switches 106, capacitors 107, a plurality of comparators 108-1 to 108-$n$, a plurality of counters 109-1 to 109-$n$, and a memory circuit 110. The memory circuit 110 includes an S-memory 111 and an N-memory 112.

Figure 3:
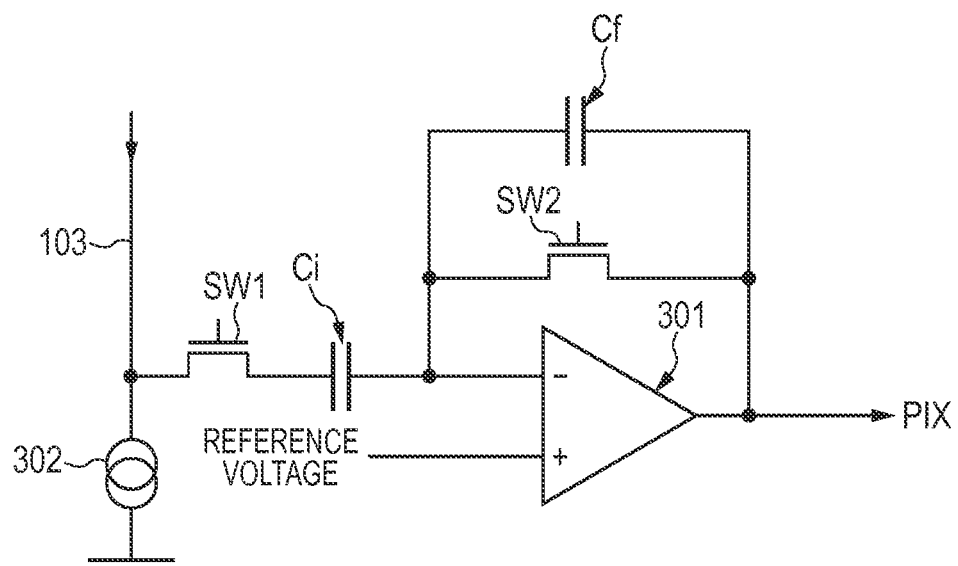
FIG. 3 is a circuit diagram illustrating a configuration example of a column amplifier circuit illustrated in FIG. 1.

FIG. 3 is a circuit diagram illustrating a configuration example of the column amplifier circuit 105 in FIG. 1. The column amplifier circuit 105 includes a current source 302, a switch SW1, an input capacitor Ci, a feedback capacitor Cf, a switch SW2, and a differential amplifier 301. The current source 302 is connected between the vertical output line 103 and a ground potential node to constitute a source follower in conjunction with the amplifier transistor 203 in FIG. 2. A series connection circuit of the switch SW1 and the input capacitor Ci is connected between the vertical output line 103 and an inverted input terminal of the differential amplifier 301. A reference voltage is input to a non-inverted input terminal of the differential amplifier 301. A parallel connection circuit of the feedback capacitor Cf and the switch SW2 is connected between the inverted input terminal and an output terminal of the differential amplifier 301. The differential amplifier 301 conducts inverted amplification, and outputs a signal PIX. On/off operations of the switches SW1 and SW2 are controlled by the timing generation circuit 117.

In FIG. 1, a reference signal generation circuit 115 includes a buffer 116. The reference signal generation circuit 115 generates one reference signal (ramp signal) Vref_1 which changes in level with time and a plurality of offset voltages (constant voltages) Vref_2 to Vref_$n$. The reference signal generation circuit 115 starts generation of the reference signal Vref_1 on the basis of a signal sig3 which is input from the timing generation circuit 117. The buffer 116 buffers the reference signal Vref_1 and outputs a reference signal R1. Furthermore, n−1 switches 106 are connected between nodes of n−1 offset voltages Vref_2 to Vref_$n$ and inverted input terminals of the n−1 comparators 108-2 to 108-$n$, respectively. The n−1 switches 106 are controlled in on/off by a signal sig1 which is input from the timing generation circuit 117. Furthermore, n−1 capacitors 107 are connected between the inverted input terminals of the n comparators 108-1 to 108-$n$, respectively. Furthermore, n reference signals R1 to Rn are input to the inverted input terminals of the n comparators 108-1 to 108-$n$, respectively. The signal PIX is input to non-inverted input terminals of the n comparators 108-1 to 108-$n$. The comparators 108-1 to 108-$n$ output a high level signal in a case where the signal PIX is greater than the reference signals R1 to Rn, respectively. The comparators 108-1 to 108-$n$ output a low level signal in a case where the signal PIX is less than the reference signals R1 to Rn, respectively.

The n counters 109-1 to 109-$n$ start counting synchronized to a clock signal CLK which is input from the timing generation circuit 117 in response to a signal sig2 which is input from the timing generation circuit 117. If output signals of the n comparators 108-1 to 108-$n$ change from a high level to a low level, the n counters 109-1 to 109-$n$ stop counting, respectively. At this time, only one of output signals of the n comparators 108-1 to 108-$n$ changes from the high level to the low level. A count value of one counter that is included in the n counters 109-1 to 109-$n$ and that stops in counting is written into the S-memory 111 or the N-memory 112 in accordance with a signal sig4 which is input from the timing generation circuit 117. The column scanning circuit 118 outputs values stored in the S-memory 111 or the N-memory 112 in the column processing circuit 104 on each column to a horizontal output line 113 in order.

Figure 4:
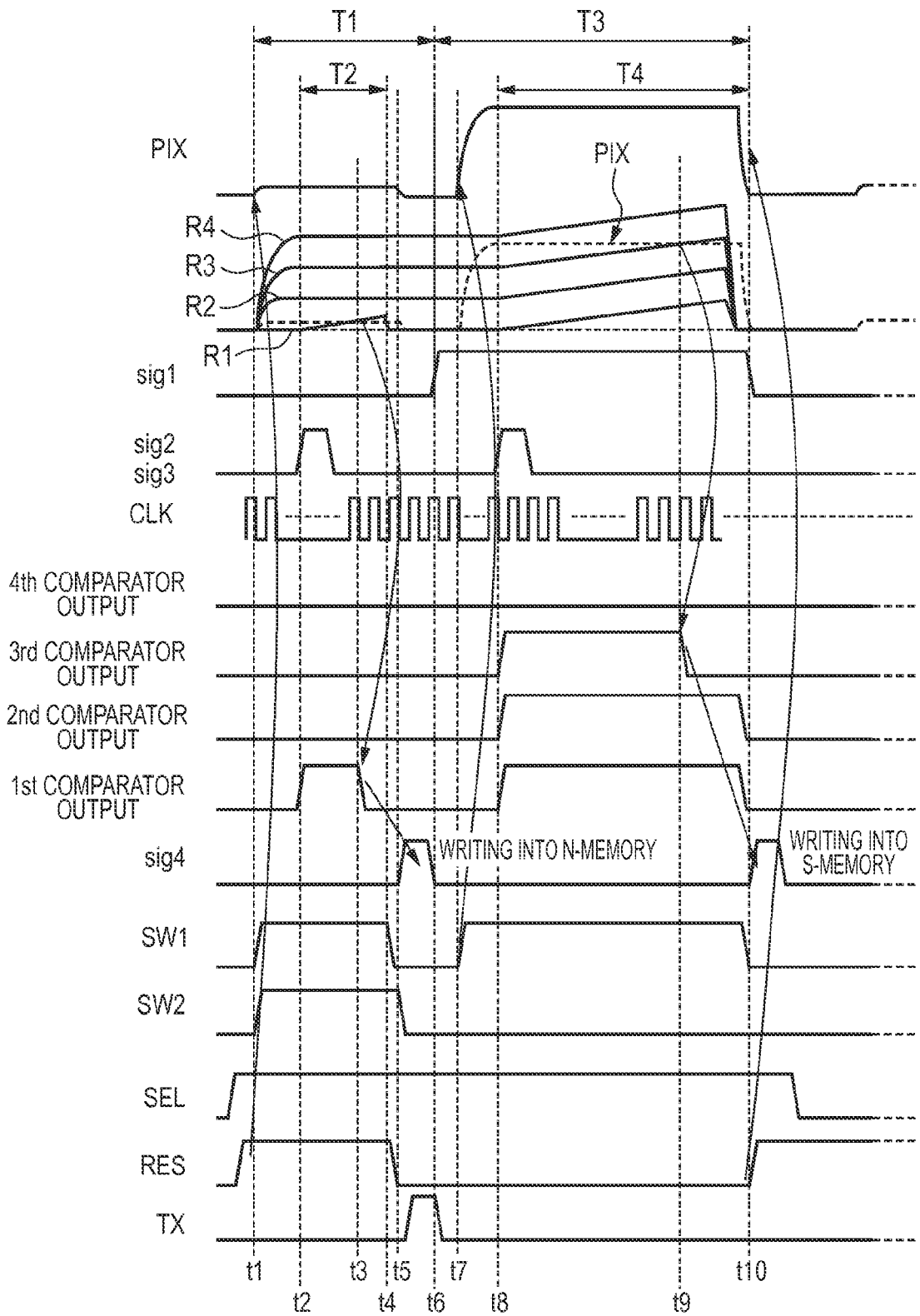
FIG. 4 is a timing chart illustrating a method of driving the solid state imaging device illustrated in FIG. 1.

FIG. 4 is a timing chart illustrating a method of driving the solid state imaging device illustrated in FIG. 1. At time t1, the signal RES is at a high level, and consequently the reset transistor 202 is on and the floating diffusion region FD is reset to the power supply voltage VDD. Furthermore, since the signal SEL is at the high level, the select transistor 204 is on and a noise signal which is a signal at time when the pixel circuit 102 is in a reset state is output to the vertical output line 103. Furthermore, the switches SW1 and SW2 turn on, and the inverted input terminal and the output terminal of the differential amplifier 301 are short-circuited to each other. As a result, the column amplifier circuit 105 is brought into a reset mode, and the column amplifier circuit 105 outputs the signal PIX functioning as a reset signal.

Furthermore, the switches 106 are turned on by the signal sig1 of a low level. The reference signal generation circuit 115 starts generation of the voltages Vref_1 to Vref_$n$. The voltages Vref_1 to Vref_$n$ are the offset voltages. As a result, the reference signals R1 to Rn become an offset voltage of a plurality of levels.

Then, at time t2, the signals sig2 and sig3 become a high level. As a result, the reference signal generation circuit 115 starts generation of the reference signal (ramp signal) Vref_1 which changes in level with time. Accordingly, the reference signal R1 also starts a level change with time in the same way as the reference signal Vref_1. Furthermore, the comparison operation in the comparators 108-1 to 108-$n$ and the count operation in the counters 109-1 to 109-$n$ are started. The first comparator 108-1 outputs a high level for a period of t2 to t3 with the reference signal R1 less than the reset signal PIX, and outputs a low level for a period of t3 to t4 with the reference signal R1 greater than the reset signal PIX. By the way, since the reference signals R2 to Rn are greater than the reset signal PIX, the comparators 108-2 to 108-$n$ maintain low-level outputs.

At time t3, the output of the first comparator 108-1 changes from the high level to the low level. As a result, the first counter 109-1 stops the count operation.

Then, at time t4, the reference signal generation circuit 115 finishes the generation of the reference signal Vref_1 which changes in level with time, and generates a signal of an offset voltage Vref_1. The reference signal R1 also becomes a constant voltage in the same way as the signal Vref_1. Furthermore, the switch SW1 turns off. Furthermore, the signal RES becomes the low level, and the reset switch 202 turns off.

Then, at time t5, the signal sig4 becomes the high level, and a count value of the first counter 109-1 which stops in count operation is written into the N-memory 112. This count value corresponds to a value obtained by conducting analog-digital conversion on the reset signal PIX. Furthermore, the switch SW2 turns off, and the column amplifier circuit 105 is brought into a gain mode. Thereafter, the signal TX becomes the high level, and the transfer transistor 201 turns on. As a result, charge subjected to the photoelectric conversion in the photoelectric conversion unit PD is transferred to the floating diffusion region FD, and the pixel signal is output to the vertical output line 103.

Then, at time t6, the signal sig1 becomes the high level, and the switches 106 turn off. Furthermore, the signal sig4 becomes the low level, and writing into the N-memory 112 is finished. Furthermore, the signal TX becomes the low level, and the transfer switch 201 turns off.

Then, at time t7, the switch SW1 turns on and the column amplifier circuit 105 inverts and amplifies the pixel signal on the vertical output line 103 and outputs the signal PIX functioning as the pixel signal. A gain in this amplification is Ci/Cf.

Then, at time t8, the signals sig2 and sig3 become the high level. As a result, the reference signal generation circuit 115 starts generation of the reference signal (ramp signal) Vref_1 which changes in level with time. As a result, the reference signals R1 to Rn start the level change with time because of a coupling via the capacitors 107, and become reference signals which differ in range of level change, respectively. By the way, the reference signals R1 to Rn are not restricted to ramp signals, but may be reference signals which change in level stepwise with time. Furthermore, the comparison operation in the comparators 108-1 to 108-n and the count operation in the counters 109-1 to 109-n are started. The third comparator 108-3 outputs the high level for a period of t8 to t9 with the reference signal R3 less than the pixel signal PIX, and outputs the low level for a period of t9 and on with the reference signal R3 greater than the pixel signal PIX. By the way, since the reference signals R4 to Rn are greater than the pixel signal PIX, the comparators 108-4 to 108-n maintain the low level outputs. Since the reference signals R1 and R2 are less than the pixel signal PIX, the comparators 108-1 and 108-2 maintain the high level outputs.

At time t9, the output of the third comparator 108-3 changes from the high level to the low level. As a result, the third counter 109-3 stops the count operation.

Thereafter, the reference signal generation circuit 115 stops generation of the reference signal Vref_1 which changes in level with time, and outputs signals Vref_1 to Vref_n of offset voltage of, for example, 0 V. As a result, the reference signals R1 to Rn become a constant voltage of, for example, 0 V.

Then, at time t10, the signal sig1 becomes the low level and the switches 106 turn on. Furthermore, the signal sig4 becomes the high level, and a count value in the third counter 109-3 which has stopped the count operation is written into the S-memory 111. This count value corresponds to a value obtained by applying analog-digital conversion to the pixel signal PIX. Furthermore, the signal RES becomes the high level, the reset switch 202 turns on, and the signal PIX becomes a reset signal. Furthermore, the switch SW1 turns off. Thereafter, the count value in the N-memory 112 and the count value in the S-memory 111 are read out onto the horizontal output line 113 in order column to column by the column scanning circuit 118, difference processing is conducted, and a noise component of the pixel signal is removed.

An offset voltage sampling period T1 of the reference signals R1 to Rn is a period of time t1 to t6. A hold period T3 of the reference signals R1 to Rn is a period of time t6 to t10. A reset signal read period T2 is a period of time t2 to t4. A pixel signal read period T4 is a period of time t8 to t10. The above-described processing with a row taken as the unit is conducted for all rows to obtain a two-dimensional image.

As described heretofore, the reference signal generation circuit 115 generates one reference signal R1 which changes in level with time. The plurality of comparators 108-1 to 108-n compares a plurality of reference signals R1 to Rn being given the plurality of offset voltages Vref_2 to Vref_n based on one reference signal R1 generated by the reference signal generation circuit 115, with the pixel signal PIX. An offset unit includes a plurality of capacitors 107 connected between the inverted input terminals of the plurality of comparators 108-1 to 108-n. The offset unit generates the plurality of reference signals R1 to Rn by giving a plurality of offset voltages Vref_2 to Vref_n to one reference signal R1 generated by the reference signal generation circuit 115, and outputs the reference signals R1 to Rn to the plurality of comparators 108-1 to 108-n. The plurality of capacitors 107 store the plurality of offset voltages Vref_2 to Vref_n. The plurality of comparators 108-1 to 108-n compare the plurality of reference signals R1 to Rn with the pixel signal PIX.

In the present embodiment, the plurality of comparators 108-1 to 108-n compare the reference signals R1 to Rn of a plurality of level ranges with the pixel signal PIX, respectively at the same time. As a result, it is possible to reconcile a higher speed and a higher resolution of analog-digital conversion processing.

A Second Embodiment

Figure 5:
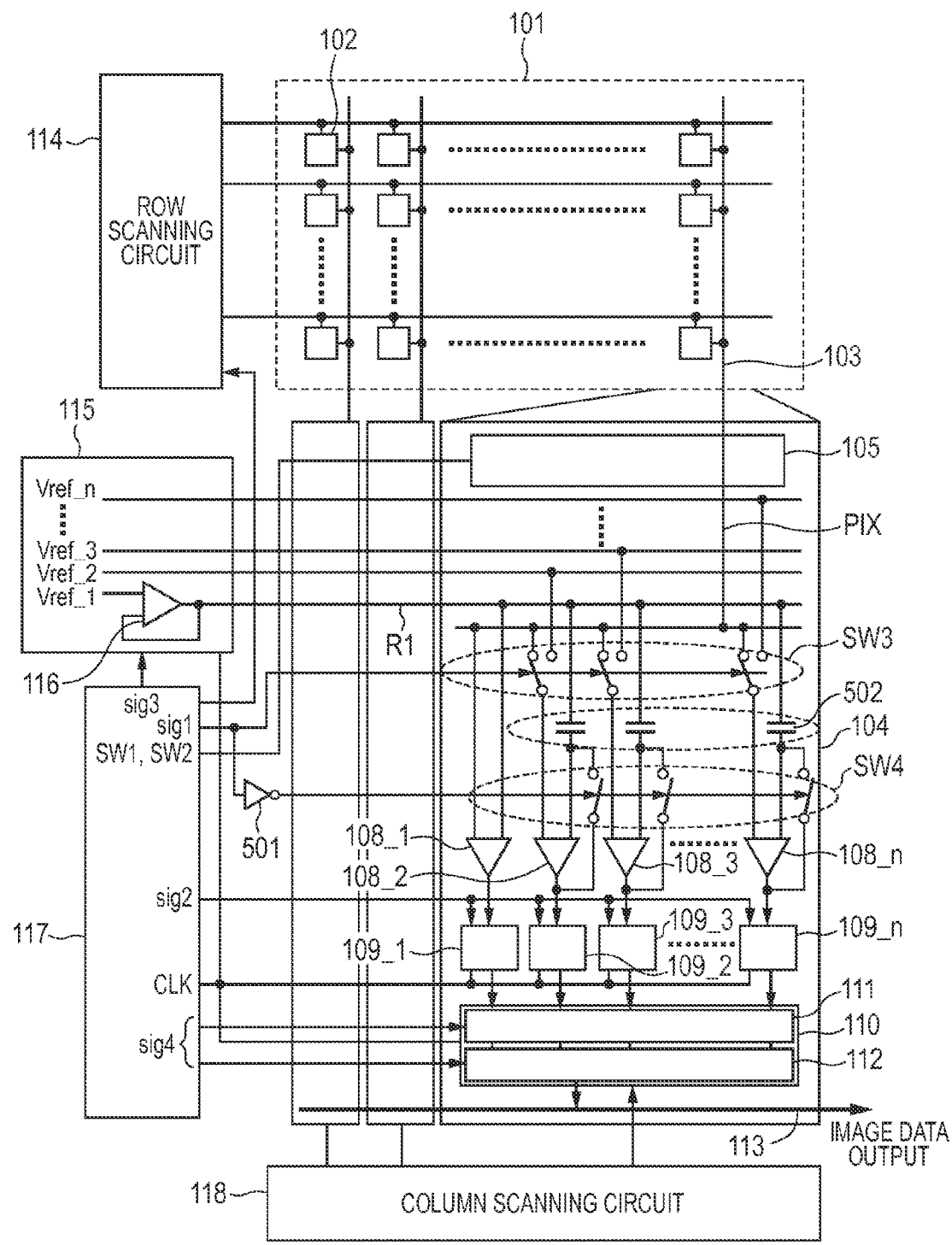
FIG. 5 is a diagram illustrating a configuration example of a solid state imaging device according to a second embodiment of the present invention.

FIG. 5 is a diagram illustrating a configuration example of a solid state imaging device according to a second embodiment of the present invention. The present embodiment (FIG. 5) is obtained by removing the switches 106 and capacitors 107 from the first embodiment (FIG. 1) and adding the switches SW3 and SW4, an inverter 501, and capacitors 502. Hereafter, points where the present embodiment differs from the first embodiment will be described. As illustrated in FIG. 6C, the inverter 501 logically inverts the signal sig1 and generates a control signal of the switches SW4. The buffer 116 outputs a signal R1 obtained by buffering the signal Vref_1. The first comparator 108-1 is connected at a non-inverted input terminal thereof to a line of the signal PIX, and connected at an inverted input terminal to a line of the reference signal R1.

FIGS. 6A, 6B and 6C are diagrams illustrating a circuit operation example of comparators in the second embodiment of the present invention. The non-inverted input terminals of the comparators 108-2 to 108-n are connected to the signal PIX or Vref_2 to Vref_n by the switches SW3, respectively. The inverted input terminals of the comparators 108-2 to 108-n are connected to comparator outputs via the switches SW4 and connected to the signal R1 via the capacitors 502. For a period T11 with the signal sig1 being at a low level in FIG. 6C, the switches SW3 connect the non-inverted input terminals of the comparators 108-2 to 108-n to lines of the signals Vref_2 to Vref_n, respectively as illustrated in FIG. 6A. The signals Vref_2 to Vref_n are offset voltages which are different from each other. For the period T11 with the output signal of the inverter 501 being at the high level, the switches SW4 turn on and short-circuit the inverted input terminals and the output terminals of the comparators 108-2 to 108-n. As a result, offset voltages of the signals Vref_2 to Vref_n and offset voltages of the comparators 108-2 to 108-n with respect to the reference signal R1 are stored in the capacitors 502. The period T11 is a sampling period of the offset voltage.

Furthermore, for a period T12 with the signal sig1 being at the high level in FIG. 6C, the switches SW3 connect the non-inverted input terminals of the comparators 108-2 to 108-n to the line of the signal PIX, respectively, as illustrated in FIG. 6B. For the period T12 with the output signal of the inverter 501 being at the low level, the switches SW4 turn off. The period T12 corresponds to the period T3 in FIG. 4, and the reference signal R1 changes in level with time.

Reference signals R2 to Rn are signals of the inverted input terminals of the comparators 108-2 to 108-*n*, respectively. Since the offset voltages between the reference signal R1 and the signals Vref_2 to Vref_n are stored in capacitors 502, the reference signals R2 to Rn become signals obtained by adding the offset voltages of the signals Vref_2 to Vref_n to the reference signal R1, respectively. The first comparator 108-1 compares the signal PIX with the reference signal R1. The comparators 108-2 to 108-*n* compare the signal PIX with the reference signals R2 to Rn, respectively.

As described heretofore, the offset unit includes a plurality of capacitors 502 connected between the reference signal R1 and the inverted input terminals of the plurality of comparators 108-2 to 108-*n*. The offset unit generates a plurality of reference signals R2 to Rn by giving a plurality of offset voltages Vref_2 to Vref_n to the reference signal R1, and outputs the reference signals R2 to Rn to the plurality of comparators 108-2 to 108-*n*. The plurality of capacitors 502 store the plurality of offset voltages Vref_2 to Vref_n in a state in which the output terminals and the inverted input terminals of the plurality of comparators 108-2 to 108-*n* are short-circuited. Thereafter, the plurality of capacitors 502 input the reference signal R1 in a state in which the output terminals of the plurality of comparators 108-2 to 108-*n* are disconnected from the input terminals. The plurality of comparators 108-1 to 108-*n* compare the plurality of reference signals R1 to Rn generated by the reference signal generation circuit 115 with the pixel signal PIX.

In the present embodiment, the plurality of comparators 108-1 to 108-*n* compare the plurality of reference signals R1 to Rn being given the plurality of offset voltages Vref_2 to Vref_n based on one reference signal R1, with the pixel signal PIX, in the same way as the first embodiment.

In the present embodiment, the plurality of comparators 108-1 to 108-*n* compare the reference signals R1 to Rn with the pixel signal PIX, respectively at the same time. As a result, it becomes possible to reconcile a higher speed and a higher resolution of analog-digital conversion processing.

A Third Embodiment

Figure 7:
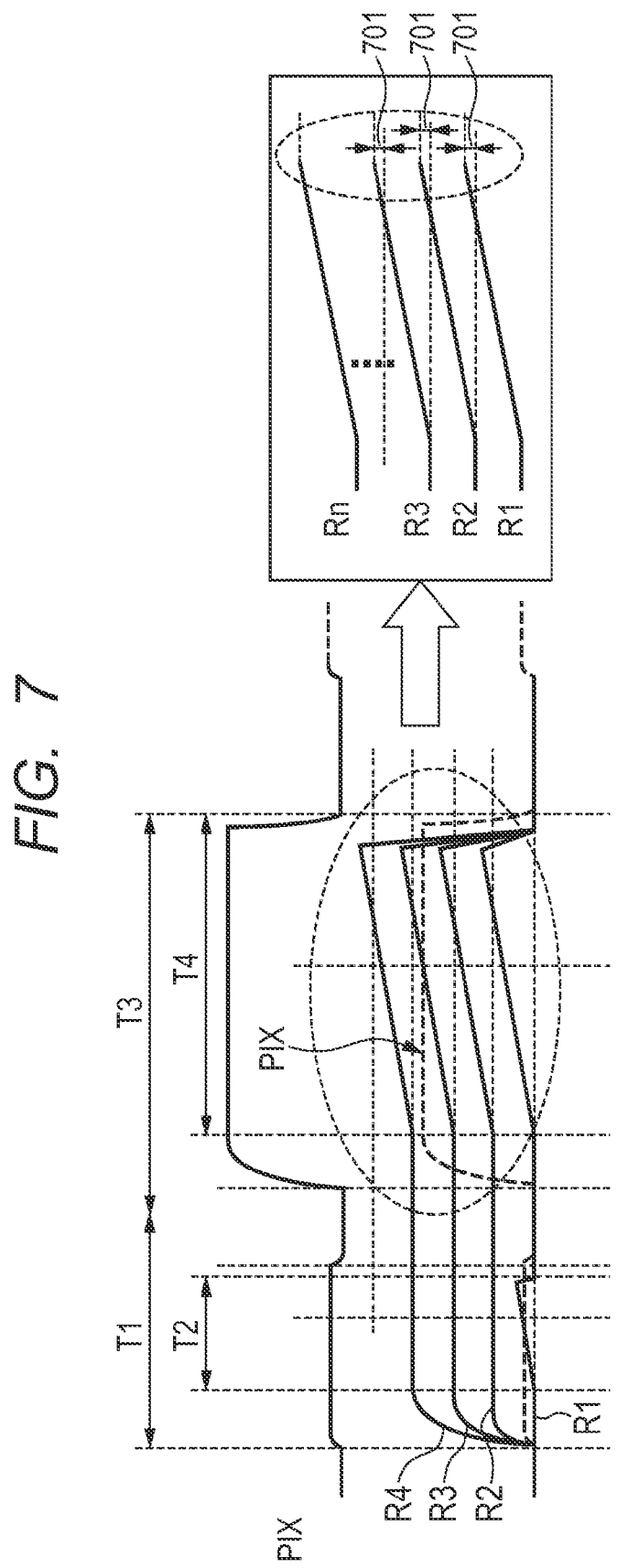
FIG. 7 is a timing chart illustrating a method of driving the solid state imaging device according to a third embodiment of the present invention.

FIG. 7 is a timing chart illustrating a method of driving a solid state imaging device according to a third embodiment of the present invention. Hereafter, points where the present embodiment differs from the first embodiment will be described. For a period T4, the plurality of reference signals R1 to Rn include areas 701 where respective level ranges overlap each other. Level ranges of the reference signals R1 to Rn vary due to the manufacture variation in some cases. Even in that case, according to the present embodiment, it is possible to prevent any of outputs of the plurality of comparators 108-1 to 108-*n* from being not inverted from the high level to the low level and it is possible to conduct analog-digital conversion certainly.

A Fourth Embodiment

Figure 8:
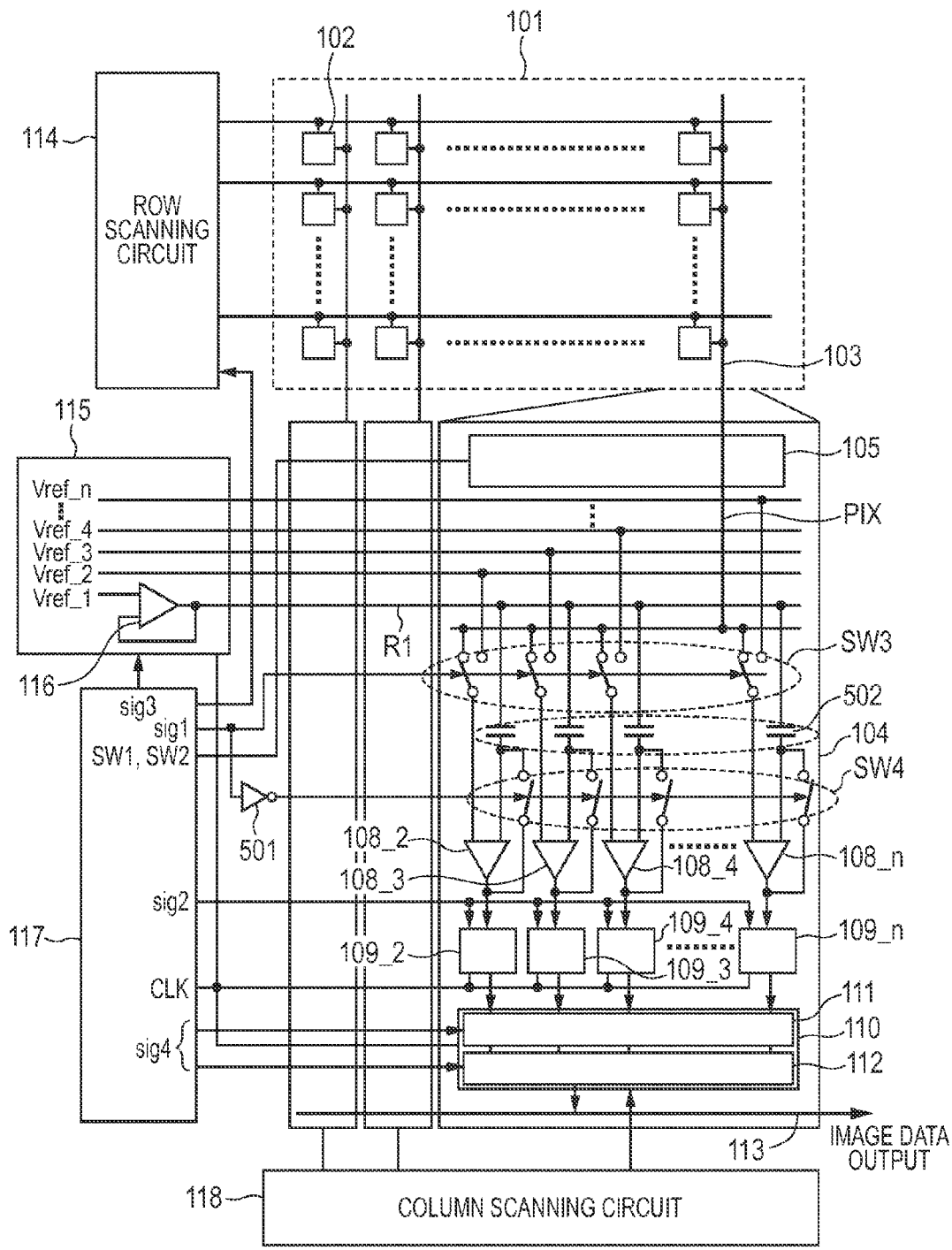
FIG. 8 is a diagram illustrating a configuration example of a solid state imaging device according to a fourth embodiment of the present invention.

FIG. 8 is a diagram illustrating a configuration example of a solid state imaging device according to a fourth embodiment of the present invention. The present embodiment (FIG. 8) is obtained by removing the first comparator 108-1 and the first counter 109-1 from the second embodiment (FIG. 5). Reference signals R2 to Rn obtained by adding offset voltages Vref_2 to Vref_n to the reference signal R1 are input to all comparators 108-2 to 108-*n* via capacitors 502. The comparators 108-2 to 108-*n* compare the reference signals R2 to Rn with the pixel signal PIX. In this case, however, it is necessary to conduct the operation in the sampling period T11 and the hold period T12 in FIG. 6C, in a reset signal read period T2 as well. In the present embodiment, it is possible to reconcile a higher speed and a higher resolution of analog-digital conversion processing in the same way as the second embodiment.

A Fifth Embodiment

Figure 9:
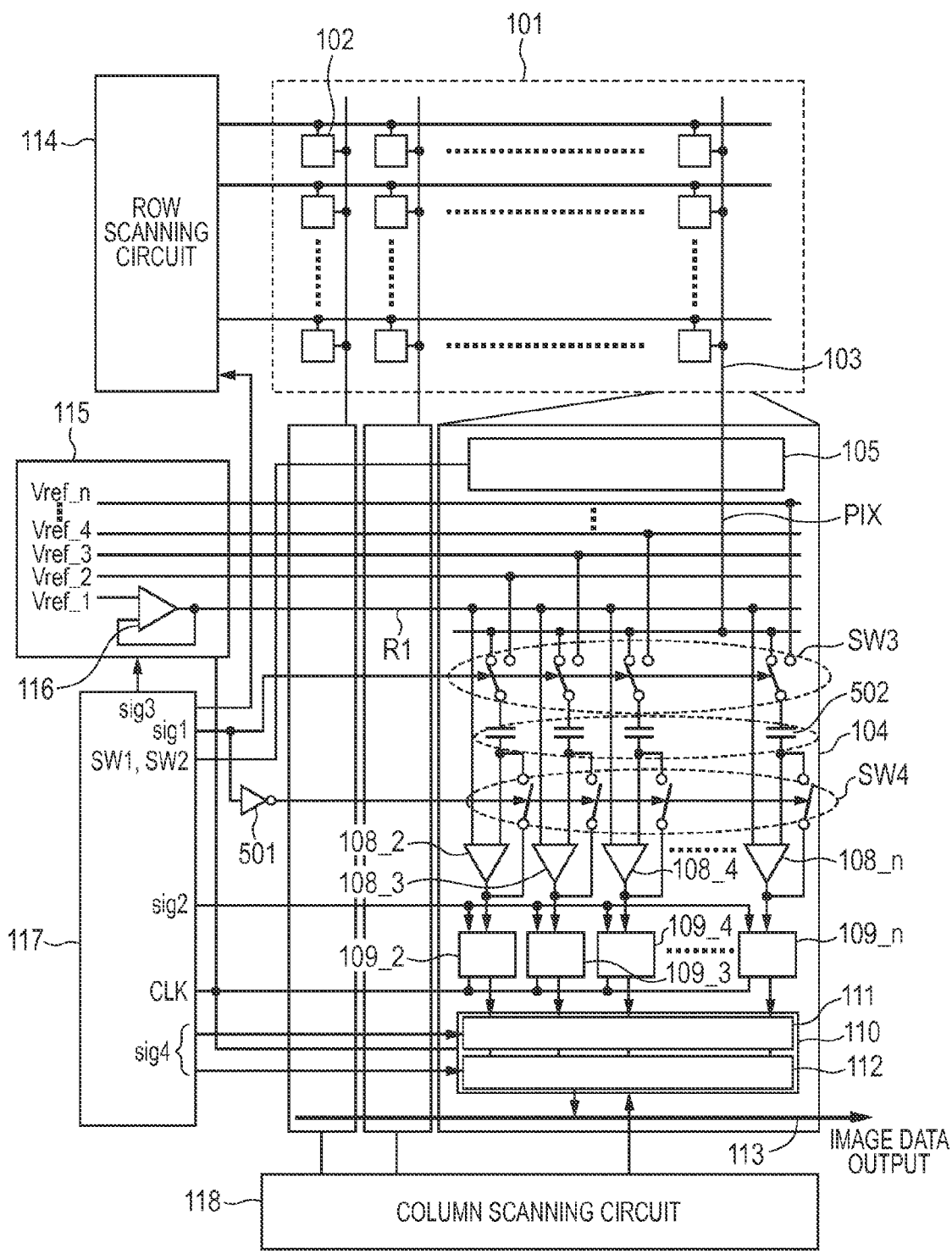
FIG. 9 is a diagram illustrating a configuration example of a solid state imaging device according to a fifth embodiment of the present invention.

FIG. 9 is a diagram illustrating a configuration example of a solid state imaging device according to a fifth embodiment of the present invention. The present embodiment (FIG. 9) is obtained by removing the first comparator 108-1 and the first counter 109-1 from the second embodiment (FIG. 5). Pixel signals P2 to Pn obtained by adding offset voltages Vref_2 to Vref_n to the pixel signal PIX are input to all comparators 108-2 to 108-*n* via capacitors 502. The comparators 108-2 to 108-*n* compare the pixel signals P2 to Pn with the reference signal R1. In this case, however, it is necessary to conduct the operation in the sampling period T11 and the hold period T12 in FIG. 6C, in a reset signal read period T2 as well.

Figure 10:
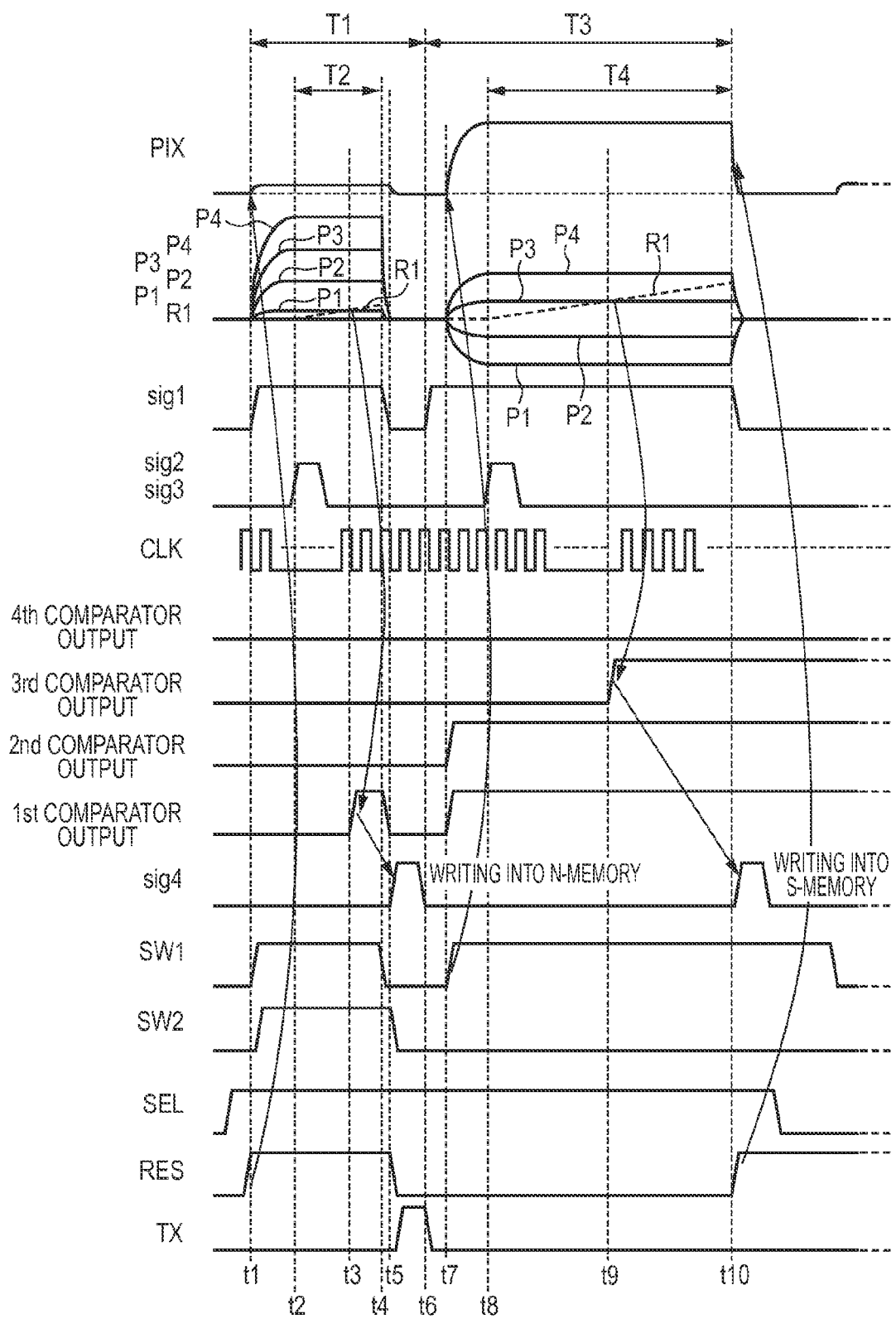
FIG. 10 is a timing chart illustrating a method of driving the solid state imaging device illustrated in FIG. 9.

FIG. 10 is a timing chart illustrating a method of driving a solid state imaging device according to the present embodiment. In the operation illustrated in FIG. 4, the reference signals R1 to R4 are compared with the pixel signal PIX for a period T3. In the present embodiment, the pixel signals P1 to P4 obtained by giving a plurality of offset voltages to the pixel signal PIX are compared with the reference signal R1 during the period T3.

FIGS. 11A, 11B and 11C are diagrams illustrating how switch control is conducted. Operation is similar to that in FIGS. 6A to 6C, and consequently description thereof will be omitted.

In the present embodiment, it is possible to reconcile a higher speed and a higher resolution of analog-digital conversion processing as the second embodiment.

Since a plurality of comparators conduct the comparison, it is possible to reconcile a higher speed and a higher resolution.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-269556, filed Dec. 26, 2013, which is hereby incorporated by reference herein in its entirety.

What is claimed is:

1. A solid state imaging device comprising:
 a pixel circuit configured to generate a pixel signal by photoelectric conversion;
 a reference signal generation circuit configured to generate a reference signal which changes in level with time;
 a plurality of comparators configured to,
  compare a plurality of reference signals being given offset voltages differing from each other, with the pixel signal, or
  compare a plurality of pixel signals being given offset voltages differing from each other, with the reference signal; and
 a plurality of sets, each including a switch and a capacitor, each of the plurality of sets being provided for a different one of the plurality of comparators and being configured to generate, based on the reference signal generated by the reference signal generation circuit, the plurality of reference signals being given offset voltages differing from each other or the plurality of pixel signals being given offset voltages differing from each other.

2. The solid state imaging device according to claim 1, wherein:
the reference signal generation circuit generates one of the plurality of reference signals which changes in level with time, and
the plurality of comparators compare the plurality of reference signals being given offset voltages differing from each other based on the one of the plurality of reference signals generated by the reference signal generation circuit, with the pixel signal.

3. The solid state imaging device according to claim 2, wherein the plurality of comparators compare the plurality of reference signals with the pixel signal.

4. The solid state imaging device according to claim 3, wherein:
the capacitors of the plurality of sets are connected between input terminals of the plurality of comparators, and
the plurality of capacitors store the offset voltages differing from each other.

5. The solid state imaging device according to claim 3, wherein level ranges of the plurality of reference signals overlap each other.

6. The solid state imaging device according to claim 4, wherein level ranges of the plurality of reference signals overlap each other.

7. The solid state imaging device according to claim 2, wherein the plurality of comparators compare the plurality of pixel signals with the one of the plurality of reference signals generated by the reference signal generation circuit.

8. The solid state imaging device according to claim 7, wherein:
each of the capacitors of the plurality of sets is connected between an output terminal of a corresponding pixel circuit and input terminal of a corresponding comparator of the plurality of comparators, and
the plurality of capacitors store a plurality of offset voltages in a state in which an output terminal and an input terminal of each of the plurality of comparators are connected, and thereafter, the pixel signal is input to the plurality of capacitors in a state in which the connection between the output terminal and the input terminal of each of the plurality of comparators is disconnected.

9. A solid-state imaging device comprising:
a pixel circuit configured to generate a pixel signal by photoelectric conversion;
a reference signal generation circuit configured to generate a reference signal which changes in level with time; and
a column processing circuit comprising:
offset units configured to give offset voltages differing from each other to a first signal;
comparators configured to obtain digital signal by comparing the first signal being given offset voltages differing from each other with a plurality of second signals;
a first node configured to receive the pixel signal generated by the pixel circuit; and
a second node configured to receive the reference signal generated in the reference signal generation circuit,
wherein one of the pixel signal or the reference signal generated by the reference signal generation circuit is input to the offset units.

10. A solid-state imaging device comprising:
a pixel circuit configured to generate a pixel signal by photoelectric conversion;
a reference signal generation circuit configured to generate a reference signal which changes in level with time; and
a column processing circuit comprising:
offset units configured to give offset voltages differing from each other to a first signal;
comparators configured to obtain digital signal by comparing the first signal being given offset voltages differing from each other with a plurality of second signals;
a first node configured to receive the pixel signal generated by the pixel circuit; and
a second node configured to receive the reference signal generated in the reference signal generation circuit,
wherein one of the pixel signal or the reference signal generated by the reference signal generation circuit is input to the offset units.

11. The solid-state imaging device according to claim 10, wherein the first signal is the reference signal generated by the reference signal generation circuit, and
wherein the second signal is the pixel signal generated by the pixel circuit.

12. The solid-state imaging device according to claim 10, wherein the column processing circuit further comprises a plurality of a switch and a capacitor, and
wherein the switch and the capacitor are configured to generate, based on the reference signal generated by the reference signal generation circuit, the plurality of reference signals being given offset voltages differing from each other or the plurality of pixel signals being given offset voltages differing from each other.

* * * * *